United States Patent [19]

Stroberger

[11] Patent Number: 4,700,087
[45] Date of Patent: Oct. 13, 1987

[54] LOGIC SIGNAL LEVEL CONVERSION CIRCUIT

[75] Inventor: Douglas J. Stroberger, Hillsboro, Oreg.

[73] Assignee: Tektronix, Inc., Beaverton, Oreg.

[21] Appl. No.: 946,457

[22] Filed: Dec. 23, 1986

[51] Int. Cl.[4] .................. H03K 19/092; H03K 5/00; H03K 19/086; H03K 5/08

[52] U.S. Cl. .................. 307/475; 307/546; 307/553; 307/455; 307/264

[58] Field of Search ........... 307/475, 546, 553, 355, 307/455, 358, 359, 456, 264, 443

[56] References Cited

U.S. PATENT DOCUMENTS

| | | | |
|---|---|---|---|
| 3,473,047 | 10/1969 | Bohn et al. | 307/456 |
| 3,676,713 | 7/1972 | Wiedmann | 307/456 |
| 3,699,355 | 10/1972 | Madrazo et al. | 307/456 |
| 3,985,954 | 10/1976 | Kuniyoshi et al. | 307/264 |
| 4,055,794 | 10/1977 | Ickes et al. | 307/300 |
| 4,415,817 | 11/1983 | Fletcher | 307/456 |

FOREIGN PATENT DOCUMENTS 0115036  9/1981  Japan .................. 307/475

Primary Examiner—Stanley D. Miller
Assistant Examiner—Trong Quang Phan
Attorney, Agent, or Firm—William S. Lovell; Daniel J. Bedell

[57] ABSTRACT

A circuit for converting an input logic signal to an output logic signal having differing high and/or low logic voltage levels includes an output transistor and a load resistor coupling a collector of the output transistor to a supply voltage. The emitter of the output transistor is grounded. An input stage clamps a base of the output transistor to ground when the input signal voltage level is low, thereby turning the output transistor off and allowing the load resistor to pull the output signal, produced at the output transistor collector, up to its high logic level. When the input signal is high, the input stage unclamps the base of the output transistor from ground and a feedback stage responsive to the output signal supplies feedback current to the base of the output transistor, which feedback current increases with the magnitude of the output logic signal. The feedback current turns on the transistor, thereby increasing load current through the load resistor so as to reduce the output signal level. As the output signal level falls, the feedback stage reduces the feedback current such that the output signal reaches equilibrium at its low logic level and such that the output transistor is unsaturated.

7 Claims, 2 Drawing Figures

LOGIC SIGNAL LEVEL CONVERSION CIRCUIT

BACKGROUND OF THE INVENTION

The present invention relates to level shifting circuits and in particular to a circuit for converting a binary input signal to a binary output signal wherein the input and output signals have differing high and/or low logic levels.

A logic signal output of a typical emitter-coupled logic (ECL) gate has high and low logic levels of about $-0.9$ and $-1.6$ volts, while a logic signal output of a typical transistor-transistor logic (TTL) gate has high and low logic levels of about 4.0 and 0.4 volts. Sometimes it is necessary to convert the output of an ECL gate to a TTL compatible signal, to adapt the output of a TTL circuit to be compatible with an ECL input or to make other such voltage conversions. One common way of converting such signal levels is shown in FIG. 1. An ECL level input signal $V_{in}$ is applied to a level shifting circuit 10 which produces an output signal applied to the base of an output transistor 12. In response to a high logic level input signal $V_{in}$, the level shifting circuit 10 produces an output voltage which is sufficient to turn on transistor 12 which then draws current through a load resistor 14 from a supply voltage $V_{CC}$. This pulls down the output signal $V_o$ at the collector of transistor 12. When the input signal $V_{in}$ is low, level shifting circuit 10 produces an output voltage which is not high enough to turn transistor 12 on and the output signal $V_o$ at the collector of transistor 12 is pulled up to the potential of $V_{CC}$. By appropriately choosing the amount of input signal level shift, the value of the load resistor 14, and the supply voltage $V_{CC}$, the TTL output signal $V_o$ can be made to vary between 0.4 and 4 volts when the ECL input signal $V_{in}$ varies between $-0.9$ and $-1.6$ volts.

The implementation of the circuit of FIG. 1 usually involves tradeoffs. Zener diodes are commonly utilized for level shifting but sometimes add expense to integrated circuits. Level shifting resistor networks can be used but tend to slow the response of the circuit. Also, due to variation in device parameters, transistor 12 can become saturated when it is turned on, thereby causing excess charge to be stored in inherent circuit capacitance between the base and emitter of transistor 12. This charge must be removed before the transistor can be turned off, and the time required to remove this charge increases the response time of the circuit. Clamping circuits are often provided to limit the fall of collector potential as the output transistor turns on, thereby preventing the output transistor 12 from saturating. Various approaches to clamping output transistors to prevent saturation are described in U.S. patents Nos. 4,415,817 to Fletcher, 3,699,355 to Madrazo et al, 3,676,713 to Wiedmann, and 3,473,047 to Bohn et al. However, clamping often adds to the power dissipation of a device and sometimes increases the amount of capacitance in the switching path which can decrease switching speed.

Feedback circuits have also been utilized to limit the voltage supplied to the base of a load transistor when its collector potential tries to fall below the base voltage. In U.S. Pat. No. 4,055,794 to Ickes et al, an operational amplifier compares the load transistor collector voltage to its base voltage or to a reference voltage, and turns on a feedback transistor when the collector voltage falls too low. The collector of the feedback transistor is coupled to the base of the output transistor and the emitter of the feedback transistor is connected to the emitter of the output transistor. When the feedback transistor turns on it reduces the base voltage of the load transistor to a point where the load transistor is not saturated. However, due to the generally slow response time of a feedback loop utilizing an operational amplifier, the output transistor will saturate before the feedback circuit can reduce the base potential enough to bring the load transistor back out of saturation. This approach is suitable for use in controlling current supplied to large motors wherein fast turnoff of the load transistor is required, but wherein overall switching speed of the circuit is not important and short term saturation of the load transistor is tolerable. However, this approach is not suitable for high speed logic systems implemented in integrated circuit form, since short term saturation of a load transistor in an integrated circuit can cause latchup.

SUMMARY OF THE INVENTION

In accordance with one aspect of the invention, a logic signal level conversion circuit converts a two-state input signal to a two-state output signal wherein high and/or low voltage logic levels of the output signal differ from high and/or low logic levels of the input signal. The conversion circuit includes an output stage comprising an output transistor and a load resistor coupling the collector of the output transistor to a supply voltage. An input stage receives the input signal and clamps the base of the output transistor to ground when the input signal is at its low logic level. A feedback stage supplies a feedback current output to the base of the output transistor, the magnitude of the feedback current increasing with the magnitude of the output signal of the conversion circuit produced at the collector of that output transistor.

When the input signal level is high, the input stage does not clamp the output transistor base voltage to ground, and all of the feedback current produced by the feedback stage passes into the base of the output transistor, driving up the potential of the base and turning on the output transistor. As the output transistor turns on, current through the load resistor increases and pulls down the collector voltage. As the collector voltage falls, the feedback stage reduces the feedback current magnitude such that the output transistor collector voltage reaches equilibrium at an appropriate low output signal logic level, with the output transistor unsaturated. When the input signal is at a low logic level, the input stage clamps the output transistor base to ground to turn the output transistor off, thereby permitting the load resistor to pull the output transistor collector up to a high output signal logic level.

In accordance with another aspect of the invention, the input stage comprises first and second transistors having emitters resistively coupled to a negative voltage source. The collector of the first transistor is resistively coupled to ground and the collector of the second transistor is coupled to ground through a first clamping diode. A second clamping diode couples the base of the output transistor to the collector of that second transistor. The input signal is applied to the base of the first transistor while a first reference voltage of magnitude between the high and low levels of the input signal is applied to the base of the second transistor. When the input signal is at its high logic level, the first transistor is on, the second transistor is off, and the base potential of the output transistor is controlled by the feedback current. When the input signal is at a low level, the first transistor is off, the second transistor is on, and the first diode clamps the collector potential of the second transistor below ground potential, thereby causing the second diode to clamp the base of the output transistor to ground potential.

In accordance with a further aspect of the invention, the feedback stage comprises a differential amplifier including third and fourth transistors having emitters resistively coupled to the negative supply voltage. The collector of the third transistor is coupled to the base of the output transistor and resistively coupled to a positive supply voltage. The collector of the fourth transistor is also coupled to the positive supply voltage. The output transistor collector is connected through a voltage divider to the base of the fourth transistor and a second reference voltage is applied to the base of the third transistor. Resistors in the voltage divider and the load resistor are sized such that the collector potential of the output transistor rises to the high logic level of the output signal when the output transistor is off. The second reference voltage is adjusted such that the collector potential of the output transistor is driven to and maintained at the low output signal logic level when the output transistor is turned on.

The feedback stage responds quickly to changes in the output voltage so that the output transistor does not temporarily saturate. The feedback stage accurately controls the output signal levels and can be adjusted to operate in conjunction with a wide range of output signal levels by appropriately choosing the values of resistors, and supply and reference voltages utilized therein.

The combined effect of both the input stage and the feedback stage of the present invention is thus to quickly convert a two-state input signal to a two-state output signal of differing high and/or low levels such that the output signal levels are accurately controlled without saturating output stage transistors.

It is accordingly an object of the invention to provide a circuit for converting a binary input signal to a binary output signal wherein high and/or low logic levels of the input signal differ from high and/or low levels of the output signal.

It is another object of the invention to provide a fast switching output stage for a logic circuit.

It is a further object of the invention to provide a means for preventing a switching transistor from saturating.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings wherein like reference characters refer to like elements.

DRAWINGS

FIG. 1 is a combination block and schematic diagram of a logic signal level conversion circuit of the prior art; and FIG. 2 is a schematic diagram of a logic signal level conversion circuit according to the present invention.

DETAILED DESCRIPTION

Figure 1:
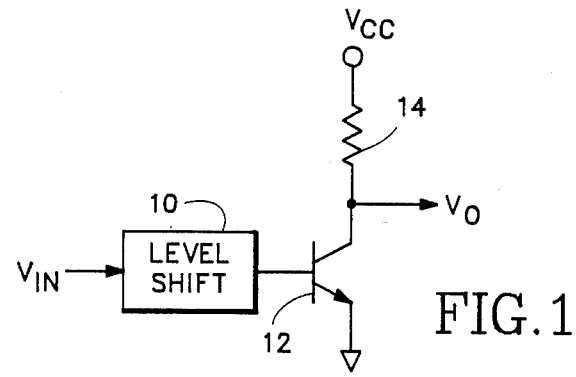
Figure 2:
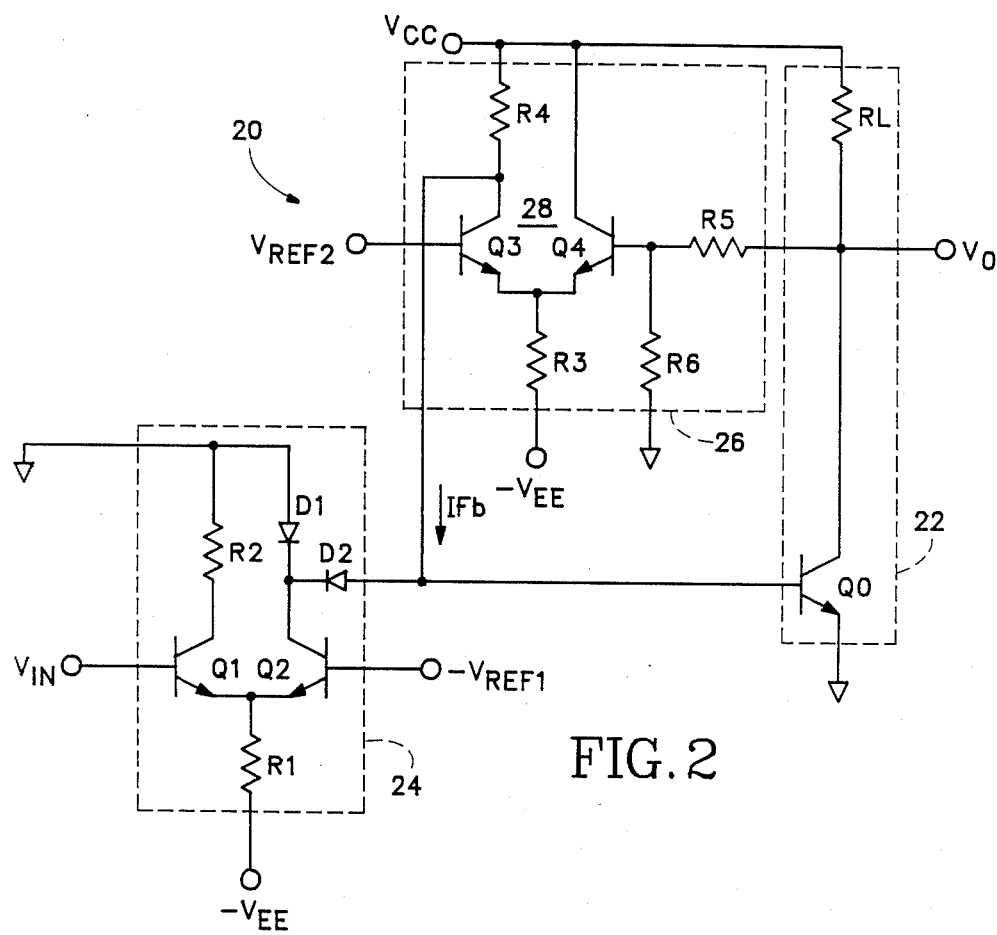

Referring to FIG. 2, depicting in schematic diagram form a signal level conversion circuit 20 according to the present invention, circuit 20 is adapted to convert a binary input signal $V_{in}$ to a binary output signal $V_o$. In the preferred embodiment of the invention, the input signal $V_{in}$ is capable of attaining high and low logic levels of $-0.9$ and $-1.6$ volts, respectively, which levels are compatible with levels of output signals produced by typical emitter-coupled logic (ECL) circuits. When $V_{in}$ is at its high logic level, circuit 20 sets the output signal $V_o$ to a low logic level of 0.4 volts, and when $V_{in}$ is at its low logic level, circuit 20 sets the output signal to a high logic level of 4.0 volts. The output signal levels of 0.4 and 4.0 volts are compatible with output signals produced by typical transistor-transistor logic (TTL) circuits. Thus the preferred embodiment of the invention is adapted to convert an ECL level signal in a high or low level state to a TTL level signal of the opposite state. It is clear that by addition of an inverter circuit to the output of level conversion circuit 20, that signal level conversion would occur between corresponding high or low level states of the ECL and TTL circuits.

Circuit 20 includes an output stage 22 comprising an output transistor Q0 and a load resistor $R_L$ that couples the collector of the output or to a supply voltage $V_{CC}$. The emitter of output transistor Q0 is grounded. The output voltage $V_o$ is produced at the collector of output transistor Q0. Circuit 20 also includes an input stage 24 for receiving input signal $V_{in}$ and for clamping the base of output transistor Q0 to ground when the input signal level is low. A feedback stage 26 produces a feedback current $I_{fb}$ of a magnitude adjusted according to the output voltage $V_o$ provided as input to the feedback stage. When input signal $V_{in}$ is at the high ECL level ($-0.9$ volts), the input stage 24 does not clamp the output transistor Q0 base to ground, and all of the feedback current $I_{fb}$ produced by the feedback stage 26 is directed into the base of the output transistor Q0. The feedback current drives up the potential of the base and turns on the output transistor. As the output transistor Q0 turns on, it draws current through the load resistor $R_L$, increasing the potential across load resistor $R_L$ and causing the voltage level of output signal $V_o$ to fall. As the level of $V_o$ falls, the feedback stage 26 reduces the magnitude of the feedback current $I_{fb}$ in order to limit the increase in potential at the base of the output transistor Q0, thereby limiting the increase in load current through load resistor $R_L$. By the time the output signal $V_o$ has fallen to a low TTL level (0.4 volts), the feedback stage 26 has reduced the feed-volts), back current $I_{fb}$ to a value just sufficient to maintain the output signal $V_o$ at that level. At this point the base of transistor Q0 is at approximately 0.7 volts and its collector is at 0.4 volts. Although the base/collector junction of output transistor Q0 has some forward bias, the 0.3 volt potential across the junction is not sufficient to drive the output transistor into saturation. Thus the output transistor Q0 is held in its active region and the output signal $V_o$ is maintained at 0.4 volts.

When the input signal $V_{in}$ is subsequently driven to an ECL low logic level ($-1.6$ volts), the input stage clamps the base of the output transistor Q0 to ground so as to rapidly turn off the output transistor. The load resistor $R_L$ then pulls up the voltage of output signal $V_o$ to a TTL high logic level (4.0 volts). Since the output transistor Q0 was not saturated when it was on, no excess charge was stored in inherent circuit capacitance coupling the base of the output transistor to ground and therefore it is not necessary for such excess charge to be removed from this capacitance in order to turn the output transistor off. Thus by preventing output transistor Q0 from saturating when it is on, its turn off time is minimized.

The input stage 24 comprises a first transistor Q1 and a second transistor Q2 having emitters coupled to a negative supply $-V_{EE}$ through a resistor R1. The collector of transistor Q1 is coupled to ground through a resistor R2 and the collector of transistor Q2 is coupled to ground through a first clamping diode D1. A second clamping diode D2 connects the base of the output transistor Q0 to the collector of transistor Q2. The input signal $V_{in}$ is applied to the base of the transistor Q1 while a first reference voltage $-V_{REF1}$ of magnitude between the high and low ECL logic levels of the input signal $V_{in}$ is applied to the base of transistor Q2.

When the input signal $V_{in}$ is at the high ECL level, transistor Q1 is on, transistor Q2 is off, and the base of output transistor Q0 is not clamped to ground. The feedback current $I_{fb}$ is therefore directed into the base of the output transistor Q0 and adjusts the base potential of transistor Q0 to about 0.7 volts.

When the input signal $V_{in}$ switches to a low ECL level, transistor Q1 turns off and transistor Q2 turns on. A portion of the collector current drawn by transistor Q2 is supplied through diode D1 and the resulting forward bias voltage drop across diode D1 pulls the potential at the collector of transistor Q2 down to approximately $-0.7$ volts. The feedback current $I_{fb}$ produced by the feedback stage 26 supplies the balance of the collector current drawn by transistor Q2 by way of diode D2. Since the resulting voltage drop across D2 is also 0.7 volts, the base of output transistor Q0 is clamped to ground potential and transistor Q0 turns off.

In the preferred embodiment of the invention, the reference voltage $-V_{REF1}$ is $-1.3$ volts, supply voltage $-V_{EE}$ is $-5.2$ volts, and resistors R1 and R2 are 1500 and 100 Ohms, respectively. When the input signal $V_{in}$ is at the low ECL level, $-1.6$ volts, the collector current through transistor Q2 is approximately 2 milliamps. It should be understood that the input stage 24 could easily be adapted to accommodate an input signal $V_{in}$ having other than ECL logic levels by appropriately adjusting the values of $-V_{REF1}$, $-V_{EE}$, R1 and R2 such that transistor Q2 is off when the input signal $V_{in}$ is at its high logic level and draws a collector current of magnitude sufficient to clamp the base of output transistor Q0 to ground when the input signal is at its low logic level. By that procedure, instead of using an inverter on the output of conversion circuit 20, the logic states of the input and output of conversion circuit 20 would be made to correspond.

The feedback stage 26 includes a differential amplifier 28 including third and fourth transistors Q3 and Q4 having emitters coupled to negative supply voltage $-V_{EE}$ through a resistor R3. The collector of transistor Q3 is connected to the base of the output transistor Q0 and is coupled through a resistor R4 to positive supply voltage $V_{CC}$. The collector of transistor Q4 is directly connected to $V_{CC}$. The collector of output transistor Q0 is coupled through a resistor R5 to the base of transistor Q4 and through a resistor R6 to ground. A second reference voltage $V_{REF2}$ is applied to the base of transistor Q3. The values of resistors $R_L$, R5 and R6 and the magnitude of $V_{CC}$ are selected such that the collector potential of the output transistor Q0 rises to the high TTL level when the output transistor Q0 is off. In the preferred embodiment of the invention, $V_{CC}$ is $+5$ volts, RL is 2.0K Ohms, and R5 and R6 are each 4.0K Ohms. When transistor Q0 is off, $V_o$ rises to 4 volts as determined by the voltage divider formed by resistors $R_L$, R5 and R6. A different high level for $V_o$ could be obtained, if desired, by suitably adjusting the values of $R_L$, R5, R6 and $V_{CC}$.

The second reference voltage $V_{REF2}$ applied to the base of transistor Q3 is selected to equal the magnitude of the voltage appearing at the base of transistor Q4 when $V_o$ is at its low logic level. Thus in the preferred embodiment of the invention, wherein the low logic level of $V_o$ is 0.4 volts, and wherein R5 and R6 have matching 4K Ohm values, $V_{REF2}$ is set to 0.2 volts. R3 and R4 suitably have values of 6K Ohms and 7.5K Ohms, respectively.

When the input stage 24 does not couple the base of output transistor Q0 to ground, and when the output signal $V_o$ rises slightly above 0.4 volts, the base of transistor Q4 rises slightly higher in potential than the base of transistor Q3. This causes transistor Q4 to carry substantially more collector current than transistor Q3 and to supply more base current to Q0. This will turn Q0 on harder and return $V_o$ to $+0.4$ volts. When the output signal $V_o$ falls slightly below 0.4 volts, the base of transistor Q4 falls slightly lower in potential than the base of transistor Q3 and the collector current in transistor Q3 increases substantially. This lowers the base potential of output transistor Q0 and causes $V_o$ to increase to $+0.4$ volts. Thus the base potential of transistor Q0 is regulated so as to maintain $V_o$ at 0.4 volts.

When the input signal is low, the input stage 24 couples the base of output transistor Q0 to ground, and the output signal $V_o$ is pulled up to 4.0 by action of the voltage divider formed by resistors $R_L$, R5 and R6. The base of transistor Q4 rises to 2.0 volts while the base of transistor Q3 remains at 0.2 volts. Transistor Q3 turns off. Since the collector of transistor Q3 is grounded, the potential across resistor R4 rises to 5 volts, thereby producing a feedback current $I_{fb}$ of 0.67 milliamps, assuming R4 has a value of 7.5K Ohms. Since the base of output transistor Q0 is clamped to ground, this feedback current is diverted away from the base of output transistor Q0 and into the collector of transistor Q2. As previously mentioned, the total collector current drawn by transistor Q2 is approximately 2.0 milliamps. $I_{fb}$ supplies 0.67 milliamps and diode D1 supplies the remaining 1.33 milliamps to transistor Q2. Since transistor Q2 can only absorb 2 milliamps of current, resistor R4 should be made large enough to limit $I_{fb}$ to less than 2 milliamps when the base of output transistor Q0 is clamped to ground. This ensures that no base current is supplied to output transistor Q0.

The voltage divider comprising resistors R5 and R6 could be eliminated by tying $V_o$ directly to the base of transistor Q4, reducing $V_{CC}$ to $+4.0$ volts, and increasing $V_{REF2}$ to 0.4 volts. However in such case, when the base of output transistor Q0 is clamped to ground, a reverse bias voltage of about 4 volts develops across the base-emitter junction of transistor Q3, and many transistors cannot tolerate such a high reverse bias voltage. Resistors R5 and R6 are therefore provided and sized to limit this reverse bias voltage to about 1.8 volts.

Thus, as has been shown and described, the logic signal conversion circuit of the present invention is adapted to convert a binary input signal to a binary output signal wherein the input and output signals may have differing high and/or low logic levels, and to do so without risk of output transistor saturation. While the preferred embodiment of the invention is adapted to convert an ECL compatible signal to a TTL compatible signal, the circuit can easily be adapted to provide conversion between logic signals utilizing other voltage levels by adjusting the values of supply and reference voltages and appropriately sizing resistor values of the circuit of FIG. 2.

It should be understood that while the preferred embodiment is implemented utilizing npn bipolar junction transistors, logic signal conversion circuits having similar topologies may be developed utilizing other types of transistors including, for example, pnp junctions transistors, MOSFETS, MESFETS, etc., of the type having two load terminals (such as collector and emitter or drain and source) and a control terminal (such as a base or a gate) for controlling current through the load terminals according to the potential of the control terminal. Thus while a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A circuit for generating an output logic signal capable of assuming high and low logic levels, comprising:
   a source of common reference potential;
   a source of first supply voltage;
   a source of second supply voltage;
   a source of reference voltage;
   a load resistor;
   an output transistor having first and second load terminals for passing a load current therebetween and a control terminal, said first load terminal being connected to said load resistor such that said load current passes through said load resistor, said second load terminal being coupled to said common reference potential;
   a first transistor having a control terminal coupled to said reference voltage, having a first load terminal resistively coupled to said second supply voltage and coupled to the control terminal of said output transistor, and having a second load terminal resistively coupled to said first supply voltage;
   a second transistor having a control terminal coupled to the first load terminal of said output transistor, having a first load terminal coupled to said second supply voltage, and having a second load terminal coupled to the second load terminal of said first transistor; and
   means responsive to the input signal for alternatively clamping and unclamping the control terminal of said output transistor to said common reference potential.

2. The circuit according to claim 1 further comprising:
   a first resistor, coupling the control terminal of said second transistor being coupled to the first load terminal of said output transistor; and
   a second resistor, coupling the control terminal of said second transistor to said common reference potential.

3. A circuit for receiving an input logic signal capable of assuming first high and first low logic levels and for generating therefrom an output logic signal capable of assuming second high and second low logic levels, comprising:
   a source of common reference potential;
   a load resistor;
   an output transistor having a first and second load terminals for passing a load current therebetween and a control terminal, said first load terminal being connected to said load resistor such that said load current passes through said load resistor, said second load terminal being coupled to said common reference potential;
   a source of first reference voltage of magnitude less than said first high logic level and greater than said first low logic level;
   first means responsive to said input signal and said first reference voltage for clamping said control terminal of said output transistor to said common reference potential when the input signal voltage level is less than said first reference voltage; and
   second means for supplying a current to said control terminal of said output transistor of magnitude according to the potential of said first load terminal of said output transistor.

4. The circuit according to claim 3 wherein said first means comprises:
   a source of first supply voltage;
   a first transistor having a control terminal for receiving said input signal, a first load terminal resistively coupled to said common reference potential, and a second load terminal resistively coupled to said first supply voltage;
   a first diode;
   a second transistor having a control terminal coupled to said first reference voltage, a first load terminal coupled to said common reference potential through said first diode, and a second load terminal coupled to the second load terminal of said first transistor; and
   a second diode coupling the first load terminal of said second transistor to the control terminal of said output transistor.

5. The circuit according to claim 3 wherein said second means comprises a differential amplifier.

6. The circuit according to claim 3 wherein said second means comprises:
   a source of second reference voltage;
   a source of second supply voltage;
   a third transistor having a control terminal coupled to said source of second reference potential, having a first load terminal resistively coupled to said second supply voltage and coupled to the control terminal of said output transistor, and having a second load terminal resistively coupled to said third supply voltage; and
   a fourth transistor having a control terminal coupled to the first load terminal of said output transistor, having a first load terminal coupled to said second supply voltage, and having a second load terminal coupled to the second load terminal of said third transistor.

7. A circuit for receiving an input logic signal capable of assuming first high and first low logic levels and for generating therefrom an output logic signal capable of assuming second high and second low logic levels, comprising:
- a source of common reference potential;
- a load resistor;
- an output transistor having first and second load terminals for passing a load current therebetween and a control terminal, said first load terminal being connected to said load resistor such that said load current passes through said load resistor, said second load terminal being coupled to said common reference potential;
- a source of first reference voltage of magnitude less than said first high logic level and greater than said first low logic level;
- a source of first supply voltage;
- a first transistor having a control terminal for receiving said input signal, a first load terminal coupled to said common reference potential, and a second load terminal resistively coupled to said first supply voltage;
- a first diode;
- a second transistor having a control terminal coupled to said first reference voltage, a first load terminal coupled to said common reference potential through said first diode, and a second load terminal coupled to the second load terminal of said first transistor;
- a second diode coupling the first load terminal of said second transistor to the control terminal of said output transistor;
- a source of second reference voltage;
- a source of second supply voltage;
- a third transistor having a control terminal coupled to said source of second reference potential, having a first load terminal resistively coupled to said second supply voltage and coupled to the control terminal of said output transistor, and having a second load terminal resistively coupled to said first supply voltage; and
- a fourth transistor having a control terminal coupled to the first load terminal of said output transistor, having a first load terminal coupled to said second supply voltage, and having a second load terminal coupled to the second load terminal of said third transistor.

* * * * *